United States Patent
Pyun et al.

(10) Patent No.: US 11,107,419 B2
(45) Date of Patent: Aug. 31, 2021

(54) DISPLAY DEVICE AND METHOD OF DRIVING THE SAME

(71) Applicant: Samsung Display Co., Ltd., Yongin-Si (KR)

(72) Inventors: Ki Hyun Pyun, Yongin-si (KR); Jang Hoon Kwak, Yongin-si (KR); Min Young Park, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/889,683

(22) Filed: Jun. 1, 2020

(65) Prior Publication Data

US 2021/0065634 A1 Mar. 4, 2021

(30) Foreign Application Priority Data

Aug. 29, 2019 (KR) ........................ 10-2019-0106204

(51) Int. Cl.
- *G09G 3/3283* (2016.01)
- *H03L 7/081* (2006.01)
- *H03L 7/08* (2006.01)

(52) U.S. Cl.
CPC ........... *G09G 3/3283* (2013.01); *H03L 7/081* (2013.01); *H03L 7/0807* (2013.01); *G09G 2300/0814* (2013.01); *G09G 2310/066* (2013.01)

(58) Field of Classification Search
CPC .......... G09G 3/3283; G09G 2300/0814; H03L 7/0807; H03L 7/081
See application file for complete search history.

(56) References Cited

U.S. PATENT DOCUMENTS

| | | | | |
|---|---|---|---|---|
| 4,902,948 A | * | 2/1990 | Sherman | G05D 1/0265 318/580 |
| 7,295,578 B1 | * | 11/2007 | Lyle | G06F 3/14 348/473 |
| 8,432,768 B2 | * | 4/2013 | Ware | G11C 7/1078 365/233.1 |
| 10,187,099 B2 | * | 1/2019 | Rasbornig | H04L 12/40 |
| 10,354,587 B2 | | 7/2019 | Kim et al. | |
| 2006/0098156 A1 | * | 5/2006 | Frisken | G01M 11/0292 349/193 |
| 2006/0274112 A1 | * | 12/2006 | Jackson Pulver | B41J 2/0451 347/42 |
| 2010/0271092 A1 | * | 10/2010 | Zerbe | G06F 1/04 327/161 |
| 2011/0181558 A1 | * | 7/2011 | Jeon | G09G 3/3611 345/204 |
| 2011/0242066 A1 | * | 10/2011 | Jeon | G09G 5/008 345/204 |

(Continued)

FOREIGN PATENT DOCUMENTS

KR 10-2016-0141232 A 12/2016
KR 10-2019-0014274 A 2/2019

*Primary Examiner* — Adam D Houston
(74) *Attorney, Agent, or Firm* — Innovation Counsel LLP

(57) ABSTRACT

A display device may extract an edge of a data signal based on the data signal and phase conversion clock signals, extract a phase of the data signal based on the edge, and generate a clock phase calibration signal based on the phase of the data signal. The display device may calibrate a phase of a clock signal using the clock phase calibration signal that has a phase corresponding to the phase of the clock signal, thereby improving transmission characteristic of the signal.

20 Claims, 9 Drawing Sheets

(56) References Cited

U.S. PATENT DOCUMENTS

| | | | |
|---|---|---|---|
| 2013/0235023 A1* | 9/2013 | Chaji | G09G 3/006 |
| | | | 345/212 |
| 2014/0300281 A1* | 10/2014 | Chaji | G09G 3/3233 |
| | | | 315/161 |
| 2015/0002488 A1* | 1/2015 | Hwang | G09G 3/00 |
| | | | 345/204 |
| 2015/0310824 A1* | 10/2015 | Yang | G09G 5/006 |
| | | | 345/213 |
| 2016/0329016 A1* | 11/2016 | Chaji | G09G 3/3225 |
| 2018/0366074 A1* | 12/2018 | Choi | G02F 1/133602 |
| 2019/0035351 A1 | 1/2019 | Pyun et al. | |
| 2019/0086480 A1 | 3/2019 | Guo | |
| 2019/0102328 A1 | 4/2019 | Tailliet | |
| 2019/0114970 A1* | 4/2019 | Moradi | G09G 3/3266 |
| 2019/0259325 A1* | 8/2019 | Chaji | G09G 3/2003 |
| 2020/0312260 A1* | 10/2020 | Kim | G09G 3/3677 |
| 2020/0335045 A1* | 10/2020 | Jeong | G09G 3/3233 |
| 2021/0065634 A1* | 3/2021 | Pyun | G09G 5/008 |

\* cited by examiner

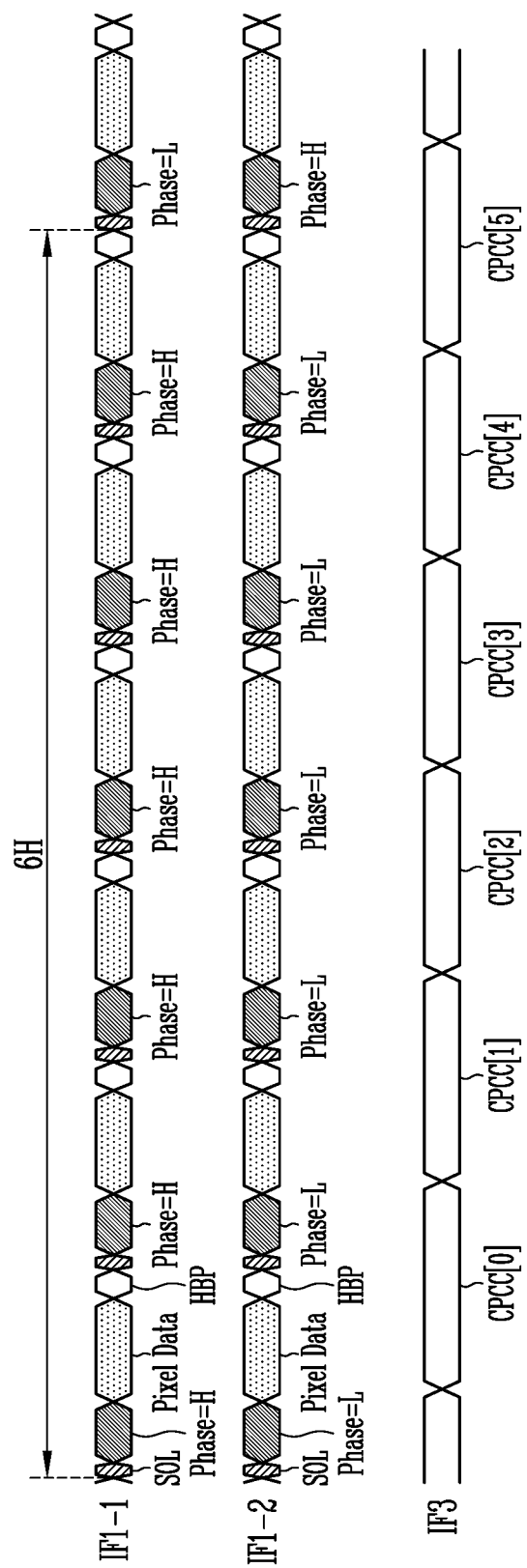

DISPLAY DEVICE AND METHOD OF DRIVING THE SAME

CROSS-REFERENCE TO RELATED APPLICATION

The present application claims priority to Korean patent application number 10-2019-0106204 filed on Aug. 29, 2019, the disclosure of which is incorporated herein in its entirety by reference.

BACKGROUND

1. Technical Field

Various embodiments of the present disclosure relate to a display device and a method of driving the display device.

2. Related Art

A display device includes pixels, a data driver for driving the pixels, and a timing controller (T-CON) configured to control the data driver.

The data driver may supply data signals to the pixels, and the pixels may emit light with luminance corresponding to the data signals supplied thereto.

In addition, the data driver may supply a sensing signal to the pixels and sense the current flowing in each of the pixels depending on the sensing signal. The display device may calibrate data depending on the sensed current and compensate for a change of the characteristic of a driving transistor in each of the pixels based on the calibrated data.

In order to transmit the sensing signal, the timing controller and the data driver may be coupled using a multi-drop method. However, in the case of the multi-drop method, because multiple branches diverge from a main line, when a signal is applied to a data driving circuit through one branch, other branches may act as stubs degrading the transmission characteristic of the signal.

Further, an interface for transmitting the sensing signal requires a clock line pair that is separate from a signal line pair, and it may increase the number of pins to be coupled. In addition, a difference between the length of the signal line pair and that of the clock line pair may cause an insufficient timing margin.

SUMMARY

Various embodiments of the present disclosure are directed to a display device and a method of driving the same that are capable of improving transmission characteristic of a signal.

A display device may include a display panel including pixels, data driving circuits configured to generate data voltages based on a first data signal and supply the data voltages to the pixels, and a timing controller configured to interface with each of the data driving circuits through a first interface and further configured to interface in common with data driving circuits through a second interface. The timing controller transmits the first data signal to the data driving circuits through the first interface and transmits a second data signal to the data driving circuits through the second interface. Each of the data driving circuits may include a clock recovery circuit configured to recover a clock signal from the first data signal, generate a recovered clock signal, and generate a reference clock signal based on the recovered clock signal, a clock generator configured to generate phase conversion clock signals having different phases by shifting the phase of the reference clock signal, and a clock phase calibrator configured to extract an edge of the second data signal based on the second data signal and the phase conversion clock signals, extract a phase of the second data signal based on the edge, and generate a clock phase calibration signal based on the phase of the second data signal. The phase of the reference clock signal may be changed in response to the clock phase calibration signal.

The clock recovery circuit may include a clock data recovery circuit configured to generate the recovered clock signal from the first data signal, and a frequency divider configured to generate a low-frequency clock signal having a frequency that is lower than the frequency of the recovered clock signal by dividing the recovered clock signal and to output the low-frequency clock signal as the reference clock signal.

The clock generator may include a phase shifter configured to generate a normal clock signal by shifting the phase of the reference clock signal, and a phase interpolator configured to generate a first phase conversion clock signal and a second phase conversion clock signal that have phases that are different from the phase of the normal clock signal. The normal clock signal, the first phase conversion clock signal, and the second phase conversion clock signal may be included in the phase conversion clock signals.

A first phase of the first phase conversion clock signal may lead the phase of the normal clock signal, and a second phase of the second phase conversion clock signal may lag behind the phase of the normal clock signal.

A first phase difference between the first phase conversion clock signal and the normal clock signal may be equal to a second phase difference between the normal clock signal and the second phase conversion clock signal.

The phase shifter controls the phase of the normal clock signal using a phase control signal, and the phase control signal may be an m-bit digital signal, where m is a natural number.

The clock phase calibrator may include a phase sampling circuit including a first sampling D flip-flop configured to generate a first sampling output by sampling the second data signal depending on the first phase conversion clock signal, a second sampling D flip-flop configured to generate a second sampling output by sampling the second data signal depending on the normal clock signal, and a third sampling D flip-flop configured to generate a third sampling output by sampling the second data signal depending on the second phase conversion clock signal, a phase aligning circuit including a first alignment D flip-flop configured to generate a first alignment output by aligning the first sampling output of the first sampling D flip-flop depending on the normal clock signal, a second alignment D flip-flop configured to generate a second alignment output by aligning the second alignment output of the second sampling D flip-flop depending on the normal clock signal, and a third alignment D flip-flop configured to generate a third alignment output by aligning the third alignment output of the third sampling D flip-flop depending on the normal clock signal, an exclusive-OR circuit configured to receive the first alignment output, the second alignment output, and the third alignment output of the phase aligning circuit, and a phase register circuit configured to store data output from the exclusive-OR circuit.

The exclusive-OR circuit may include a first exclusive-OR circuit configured to receive the first alignment output of the first alignment D flip-flop and the second alignment output of the second alignment D flip-flop, and a second exclusive-OR circuit configured to receive the second alignment output of the second alignment D flip-flop and the third alignment output of the third alignment D flip-flop.

The phase register circuit may include n first count registers configured to sequentially store a first output of the first exclusive-OR circuit, where n is a natural number that is equal to or greater than 2, and n second count registers configured to sequentially store a second output of the second exclusive-OR circuit. n may be equal to the value of $2^m$.

The clock phase calibrator may further include a control circuit configured to extract the edge of the second signal by comparing the first output of the first exclusive-OR circuit with the second output of the second exclusive-OR circuit based on pieces of phase data stored in the n first count registers and the n second count registers, extract the phase of the second data signal based on the edge, select one of the phase conversion clock signals having a phase corresponding to the phase of the second data signal, and generate the clock phase calibration signal based on a selected phase conversion clock signal among the phase conversion clock signals.

The phase of the selected phase conversion clock signal may be a median value of the phases of the phase conversion clock signals that have a phase corresponding to the phase of the second data signal.

The data driving circuits may be coupled to the timing controller through a third interface that is different from the first interface and the second interface, and may transmit the clock phase calibration signal to the timing controller through the third interface.

The first data signal may include reference clock phase information for determining the phase of the reference clock signal, the timing controller may change the reference clock phase information based on the clock phase calibration signal, and the phase of the reference clock signal may be changed based on the reference clock phase information that is changed by the timing controller.

Each of the data driving circuits may further include a sampler configured to sample the second data signal depending on the reference clock signal.

Each of the data driving circuits may further include a first switching element coupled to the clock phase calibrator, and a second switching element coupled to the sampler. The first switching element may be turned on in a first period and transmit the second data signal to the clock phase calibrator in the first period, and the second switching element may be turned on in a second period that is different from the first period, and transmit the second data signal to the sampler in the second period.

A method of driving a display device may include transmitting a first data signal from a timing controller to each of data driving circuits through a first interface, transmitting a second data signal from the timing controller to the data driving circuits through a second interface that is different from the first interface, recovering a clock signal from the first data signal and generating a reference clock signal based on the clock signal, generating phase conversion clock signals having different phases by shifting the phase of the reference clock signal, extracting the edge of the second data signal based on the second data signal and the phase conversion clock signals, extracting the phase of the second data signal based on the edge and generating a clock phase calibration signal based on the phase of the second data signal, and changing the phase of the reference clock signal in response to the clock phase calibration signal.

Generating the reference clock signal may include recovering the clock signal from the first data signal using a clock data recovery circuit, generating a low-frequency clock signal having a frequency that is lower than the frequency of the recovered clock signal by dividing the recovered clock signal using a frequency divider, and outputting the low-frequency clock signal as the reference clock signal.

Generating the phase conversion clock signals may include generating a normal clock signal by shifting the phase of the reference clock signal using a phase shifter, and generating a first phase conversion clock signal and a second phase conversion clock signal that have phases that are different from the phase of the normal clock signal using a phase interpolator. The normal clock signal, the first phase conversion clock signal, and the second phase conversion clock signal may be included in the phase conversion clock signals.

Extracting the edge of the second data signal may include generating a first sampling output, a second sampling output, and a third sampling output by respectively sampling the second data signal depending on the normal clock signal, the first phase conversion clock signal, and the second phase conversion clock signal using a phase sampling circuit, generating a first alignment output, a second alignment output, and a third alignment output by respectively aligning the first sampling output, the second sampling output, and the third sampling output of the phase sampling circuit depending on the normal clock signal using a phase aligning circuit, performing an exclusive-OR operation on the first alignment output, the second alignment output, and the third alignment output of the phase aligning circuit using an exclusive-OR circuit, storing data output from the exclusive-OR circuit in a phase register circuit, and extracting the edge of the second data signal by comparing the output of the exclusive-OR circuit using a control circuit. Generating the clock phase calibration signal may include extracting the phase of the second data signal based on the edge and selecting one of the phase conversion clock signals having a phase corresponding to the phase of the second data signal, and generating the clock phase calibration signal based on a selected phase conversion clock signal among the phase conversion clock signals.

The method may further include transmitting, by the data driving circuit, the clock phase calibration signal to the timing controller through a third interface that is different from the first interface and the second interface, changing, by the timing controller, reference clock phase information based on the clock phase calibration signal and changing the phase of the reference clock signal based on the reference clock phase information that is changed by the timing controller, and sampling, by each of the data driving circuits, the second data signal depending on the reference clock signal using a sampler.

BRIEF DESCRIPTION OF THE DRAWINGS

FIG. 8 is a diagram illustrating an example of a data package transmitted between the timing controller and the data driver included in the display device of FIG. 1.

DETAILED DESCRIPTION

Figure 1:
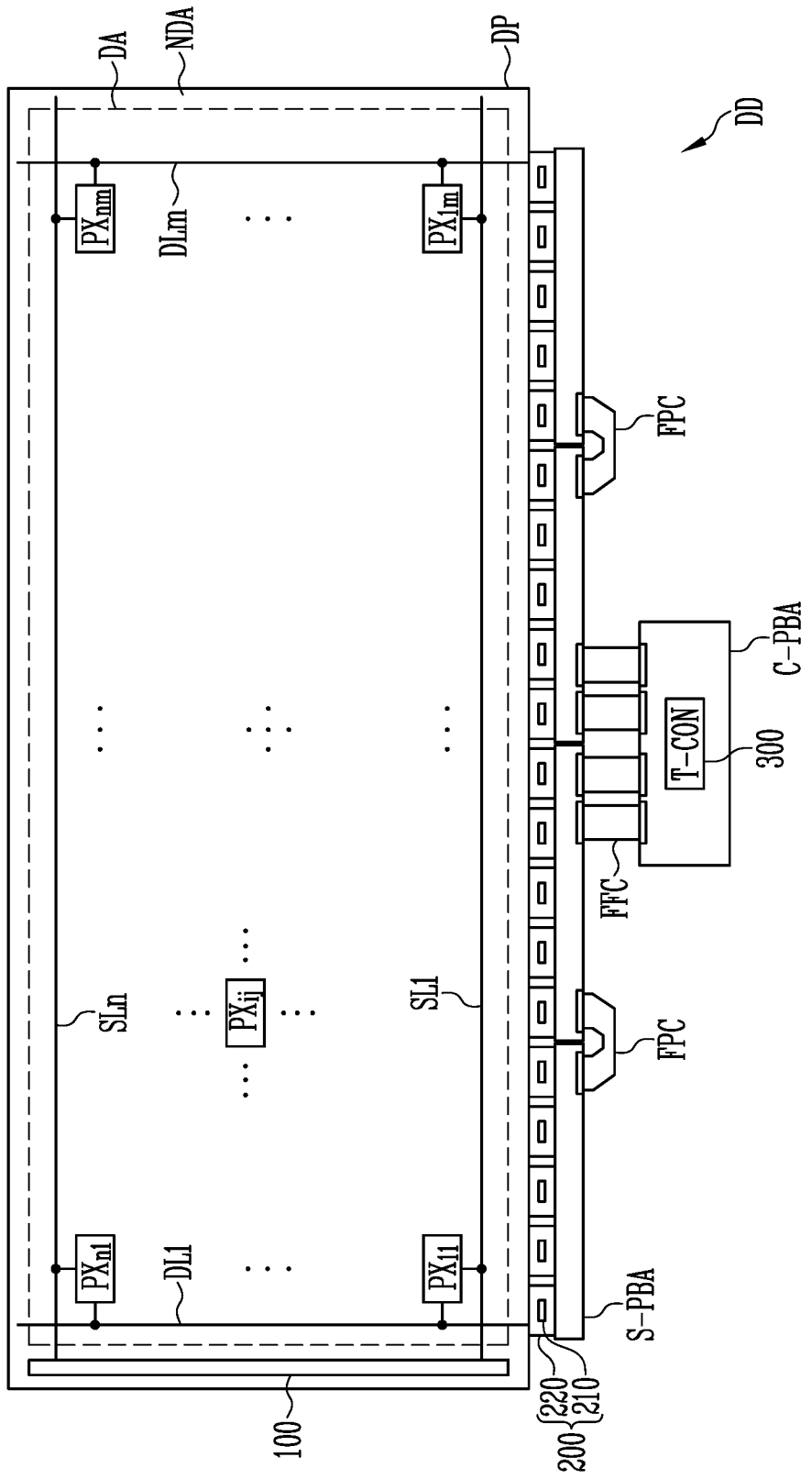
FIG. 1 is a top plan view of a display device according to embodiments of the present disclosure.

Hereinafter, embodiments of the present disclosure will be described in detail with reference to the attached drawings, such that those skilled in the art can easily implement the present disclosure. The present disclosure may be embodied in various different forms without being limited to the following embodiments.

Further, in the drawings, portions that are not related to the present disclosure will be omitted to explain the present disclosure more clearly. Reference should be made to the drawings, in which similar reference numerals are used throughout the present disclosure in different drawings to designate similar components. Therefore, reference numerals described in a previous drawing may be used in other drawings.

Although the sizes and thicknesses of respective components are arbitrarily indicated in drawings for convenience of description, the present disclosure is not limited by the drawings. For example, the sizes, thicknesses, etc. of components in the drawings may be exaggerated to clarify the description of a plurality of layers and areas illustrated therein.

FIG. 1 is a top plan view of a display device according to embodiments of the present disclosure.

Referring to FIG. 1, a display device DD may include a display panel DP, a scan driver 100, a data driver 200, and a timing controller 300.

In an embodiment, the display panel DP may be an organic light-emitting display panel. However, the display panel DP is not limited thereto. For example, the display panel DP may be a liquid crystal display panel, an organic light-emitting display panel, an electrophoretic display panel, an electrowetting display panel, or the like.

The display panel DP may include a display area DA in which pixels PX11 to PXnm are disposed and a non-display area NDA surrounding the display area DA (where each of n and m is a natural number that is greater than 1).

The display panel DP may include scan lines SL1 to SLn and data lines DL1 to DLm that intersect with the scan lines SL1 to SLn. The scan lines SL1 to SLn may be coupled to the scan driver 100, and the data lines DL1 to DLm may be coupled to the data driver 200. Although not illustrated in FIG. 1, the display panel DP may further include control lines and sensing lines. The control lines may be coupled to the scan driver 100, and the sensing lines may be coupled to the data driver 200.

The pixels PX11 to PXnm may be coupled to corresponding ones of the scan lines SL1 to SLn and corresponding ones of the data lines DL1 to DLm. For example, the nm-th pixel PXnm may be coupled to the n-th scan line SLn and the m-th data line DLm. In addition, the pixels PX11 to PXnm may be coupled to corresponding ones of the control lines and corresponding ones of the sensing lines.

The pixels PX11 to PXnm may be supplied with scan signals through corresponding ones of the scan lines SL1 to SLn, and may be supplied with data voltages through corresponding ones of the data lines DL1 to DLm. The pixels PX11 to PXnm may receive the data voltages depending on the scan signals, and may emit light with grayscales corresponding to the data voltages. In addition, the pixels PX11 to PXnm may be supplied with control signals through corresponding ones of the control lines, and a value acquired by sensing the characteristic information of each of the pixels PX11 to PXnm may be output to the data driver 200 through a corresponding one of the sensing lines. A detailed description thereof will be made later with reference to FIG. 2.

The scan driver 100 may generate scan signals based on a scan control signal, and may supply the scan signals to the scan lines SL1 to SLn. For example, the scan driver 100 may sequentially supply the scan signals to the scan lines SL1 to SLn.

The data driver 200 may generate data voltages based on an image data signal, a clock signal, and the like, and may supply the data voltages to the data lines DL1 to DLm.

The data driver 200 may generate sensing data voltages based on a signal for sensing the characteristic of a pixel (hereinafter, referred to as a sensing data signal), and may supply the sensing data voltages to the data lines DL1 to DLm.

The data driver 200 may include data driving circuits 210 and first flexible circuit boards 220. Each of the data driving circuits 210 may be mounted in a respective one of the first flexible circuit boards 220. The multiple data driving circuits 210 and the multiple first flexible circuit boards 220 may be provided.

The data driving circuits 210 may supply a data voltage and a sensing data voltage to corresponding ones of the data lines DL1 to DLm. Accordingly, the data driving circuits 210 may supply the data voltage and the sensing data voltage to the corresponding ones of the pixels PX11 to PXnm. Each of the data driving circuits 210 may be a driver integrated circuit D-IC.

The first flexible circuit boards 220 may electrically couple a second circuit board S-PBA to the display panel DP. Some of the first flexible circuit boards 220 may be coupled to a single second circuit board S-PBA.

A second flexible circuit board FPC may couple the second circuit board S-PBA to another second circuit board S-PBA adjacent thereto. The second circuit board S-PBA may be coupled to a first circuit board C-PBA through a flexible flat cable FFC.

The timing controller 300 may be mounted in the first circuit board C-PBA. The first circuit board C-PBA may be a printed board assembly PBA.

The display device DD may include lines for coupling the timing controller 300 to the scan driver 100. The timing controller 300 may supply a scan control signal to the scan driver 100 through the lines.

In addition, the display device DD may include an interface for coupling the timing controller 300 to the data driver 200. The timing controller 300 may supply an image data signal, a clock signal, a sensing data signal, and the like to the data driver 200 through the interface. A detailed description of the interface and various kinds of signals supplied through the interface will be made later with reference to FIG. 3A and FIG. 3B.

Figure 2:
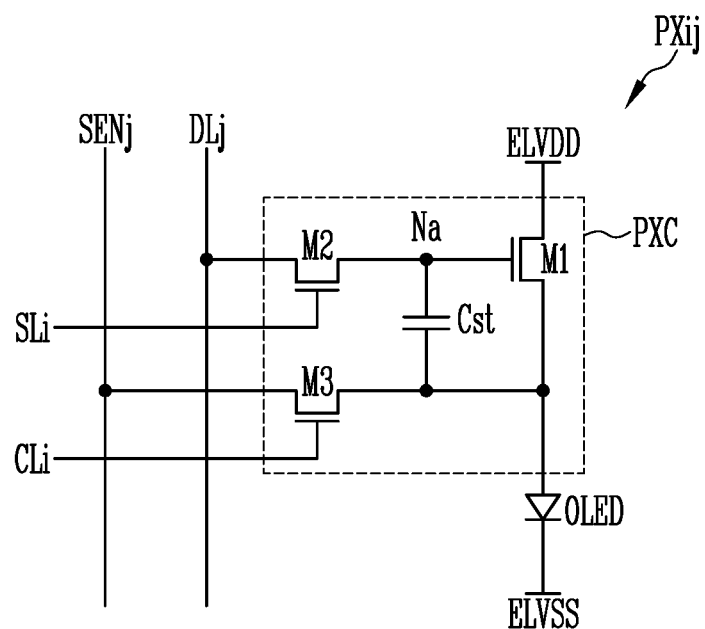
FIG. 2 is a circuit diagram illustrating an example of a pixel included in the display device of FIG. 1.

FIG. 2 is a circuit diagram illustrating an example of a pixel included in the display device DD of FIG. 1. For the convenience of description, FIG. 2 illustrates the ij-th pixel PXij coupled to the i-th scan line SLi and the j-th data line DLj.

Referring to FIG. 2, the ij-th pixel PXij may include a pixel circuit PXC and a light-emitting element OLED. The light-emitting element OLED may refer to an organic light-emitting diode including a first electrode and a second electrode.

The first electrode (e.g., anode electrode) of the organic light-emitting diode OLED may be coupled to the pixel circuit PXC, and the second electrode (e.g., cathode electrode) thereof may be coupled to a second power source ELVSS. The organic light-emitting diode OLED may emit light with luminance corresponding to a driving current that is supplied from the pixel circuit PXC.

The pixel circuit PXC may control the driving current flowing from a first power source ELVDD to the second power source ELVSS via the organic light-emitting diode OLED, in response to a data voltage received from the data line DLj.

In an embodiment, the pixel circuit PXC may include a first transistor M1 (also referred to as a driving transistor), a second transistor M2 (also referred to as a switching transistor), a third transistor M3 (also referred to as a sensing control transistor), and a storage capacitor Cst.

In an embodiment, the first transistor M1 may be an oxide semiconductor thin-film transistor including an activation layer formed of an amorphous or crystalline oxide semiconductor. In some embodiments, the first to third transistors M1 to M3 may be oxide semiconductor thin-film transistors. The oxide semiconductor thin-film transistor is known to have a superior off-current characteristic.

In another embodiment, at least one of the first to third transistors M1 to M3 may be a Low-Temperature Poly-Silicon (LTPS) thin-film transistor including an activation layer formed of polysilicon. The LTPS thin-film transistor is known to have high electron mobility and a fast driving characteristic.

The first electrode of the first transistor M1 may be coupled to the first power source ELVDD, and the second electrode thereof may be coupled to the first electrode of the organic light-emitting diode OLED. The gate electrode of the first transistor M1 may be coupled to a first node Na. The first transistor M1 may control the amount of the driving current flowing from the first power source ELVDD to the second power source ELVSS via the organic light-emitting diode OLED in response to the voltage of the first node Na.

The first electrode of the second transistor M2 may be coupled to the data line DLj, and the second electrode thereof may be coupled to the first node Na. The gate electrode of the second transistor M2 may be coupled to the scan line SLi. The second transistor M2 is turned on when a scan signal is supplied to the scan line SLi, thereby electrically coupling the data line DLj to the first node Na.

The first electrode of the third transistor M3 may be coupled to the second electrode of the first transistor M1, and the second electrode thereof may be coupled to a sensing line SENj. The gate electrode of the third transistor M3 may be coupled to a control line CLi. Meanwhile, in an embodiment where the control line CLi is omitted, the gate electrode of the third transistor M3 may be alternatively coupled to the scan line SLi. The third transistor M3 is turned on when a control signal is supplied to the control line CLi during a sensing period, thereby electrically coupling the sensing line SENj to the second electrode of the first transistor M1.

The storage capacitor Cst may be coupled between the first node Na and the second electrode of the first transistor M1 (and the first electrode of the third transistor M3 that is coupled to the second electrode of the first transistor M1). The storage capacitor Cst may store the voltage of the first node Na.

The circuit structure of the ij-th pixel PXij is not limited to that illustrated in FIG. 2. For example, in an alternative embodiment, the organic light-emitting diode OLED may be placed between the first power source ELVDD and the first transistor M1.

In FIG. 2, the first to third transistors M1 to M3 are illustrated as N-type metal-oxide-semiconductor (NMOS) transistors, but the present disclosure is not limited thereto. For example, at least one of the first to third transistors M1 to M3 may be formed of a P-type metal-oxide-semiconductor (PMOS) transistor.

The luminance of the above-described ij-th pixel PXij is set mainly depending on a data voltage received from the data line DLj. However, the characteristics of the first transistor M1 and/or that of the organic light-emitting diode OLED may affect the luminance of the ij-th pixel PXij. For example, the characteristics of the first transistor M1 and/or that of the organic light-emitting diode OLED may be changed depending on a time over which the first transistor M1 and/or the organic light-emitting diode OLED are/is used.

The pixel structure described in the present disclosure can sense the characteristic information of a pixel during a predetermined sensing period, and compensate for the characteristic information sensed for each pixel.

Figure 3A:
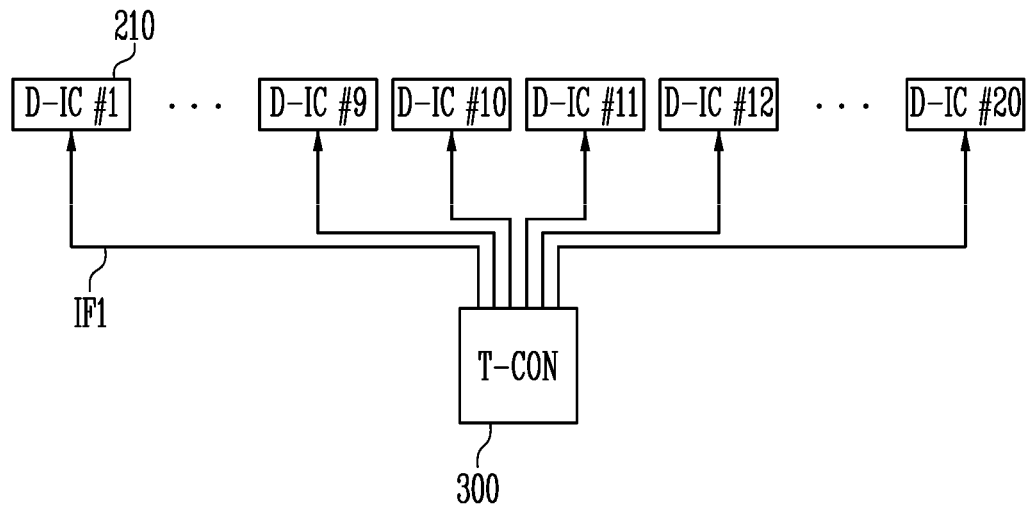
FIG. 3A is a diagram illustrating an example of a first interface that couples the timing controller to the data driving circuit included in the display device of FIG. 1.

FIG. 3A is a diagram illustrating an example of a first interface that couples the timing controller 300 to the data driving circuit 210 that are included in the display device DD of FIG. 1.

Referring to FIG. 3A, a first interface IF1 may couple the timing controller 300 to the data driving circuit 210. The first interface IF1 may include multiple interface lines based on the number of the data driving circuits 210, and each of the multiple interface lines may couple the timing controller 300 to the corresponding one of the multiple data driving circuits 210.

The timing controller 300 may supply each of the data driving circuits 210 with a first data signal DATA1 (shown in FIG. 4) through the first interface IF1. The data driving circuits 210 may receive the first data signal DATA1 through the first interface IF1.

The first data signal DATA1 may be an image data signal. In an embodiment, the first data signal DATA1 may include an embedded clock signal.

The first data signal DATA1 may carry serial data, and the first interface IF1 configured to transmit the first data signal DATA1 may be a high-speed serial interface. In an embodiment, the first interface IF1 may be a Universal Serial Interface (USI) or a Universal Serial Interface for TV (USI-T).

The data driving circuits 210 may recover a clock signal from the first data signal DATA1 using a clock data recovery circuit, and a detailed description thereof will be made later with reference to FIG. 4.

As described above with reference to FIG. 2, the data driving circuits 210 may generate data voltages based on the first data signal DATA1 and supply the data voltages to the corresponding ones of the data lines DL1 to DLm.

Figure 3B:
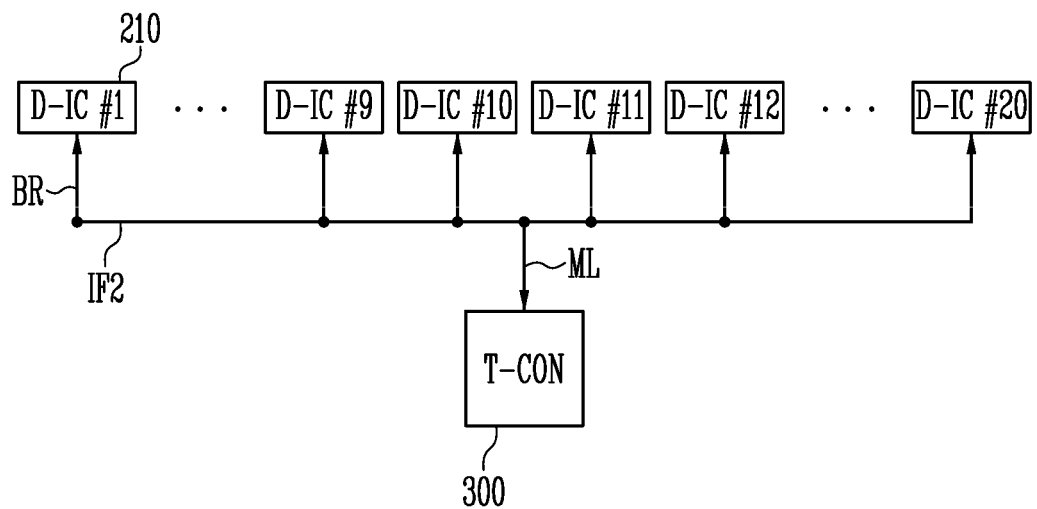
FIG. 3B is a diagram illustrating an example of a second interface that couples the timing controller to the data driving circuit included in the display device of FIG. 1.

FIG. 3B is a diagram illustrating an example of a second interface that couples the timing controller 300 to the data driving circuits 210 included in the display device DD of FIG. 1.

Referring to FIG. 3B, a second interface IF2 may couple the timing controller 300 to the data driving circuits 210. The second interface IF2 may commonly couple the timing controller 300 and the data driving circuits 210. In an embodiment, the coupling method of the second interface IF2 may be a multi-drop method. Based on the multi-drop method, the second interface IF2 may include a single main line ML that is coupled to the timing controller 300 and multiple branches BR that diverge from the main line ML and are coupled to the respective ones of the data driving circuits 210.

The timing controller 300 may supply each of the data driving circuits 210 with a second data signal DATA2 (shown in FIG. 4) through the second interface IF2. Each of the data driving circuits 210 may receive the second data signal DATA2 through the corresponding second interface IF2. The phase of the second data signal DATA2 may be different depending on the length of each of the branches BR of the second interface IF2 that are coupled to the respective ones of the data driving circuits 210.

The second data signal DATA2 may be a sensing data signal.

As described above with reference to FIG. 2, the data driving circuits 210 may generate sensing data voltages based on the second data signal DATA2 and supply the sensing data voltages to the corresponding ones of the data lines DL1 to DLm. A pixel may output a value acquired by sensing the characteristic information of the pixel during a sensing period (hereinafter, referred to as a sensing value) to the data driving circuits 210 through the sensing line SENj that is coupled to the pixel.

The data driving circuits 210 may supply the sensing value to the timing controller 300 through the second interface IF2. The timing controller 300 may receive the sensing value through the second interface IF2.

Meanwhile, the number of data driving circuits 210 is illustrated as 20 in FIG. 1, FIG. 3A, and FIG. 3B as an example, and it is understood that the number of data driving circuits 210 is not limited thereto.

Figure 4:
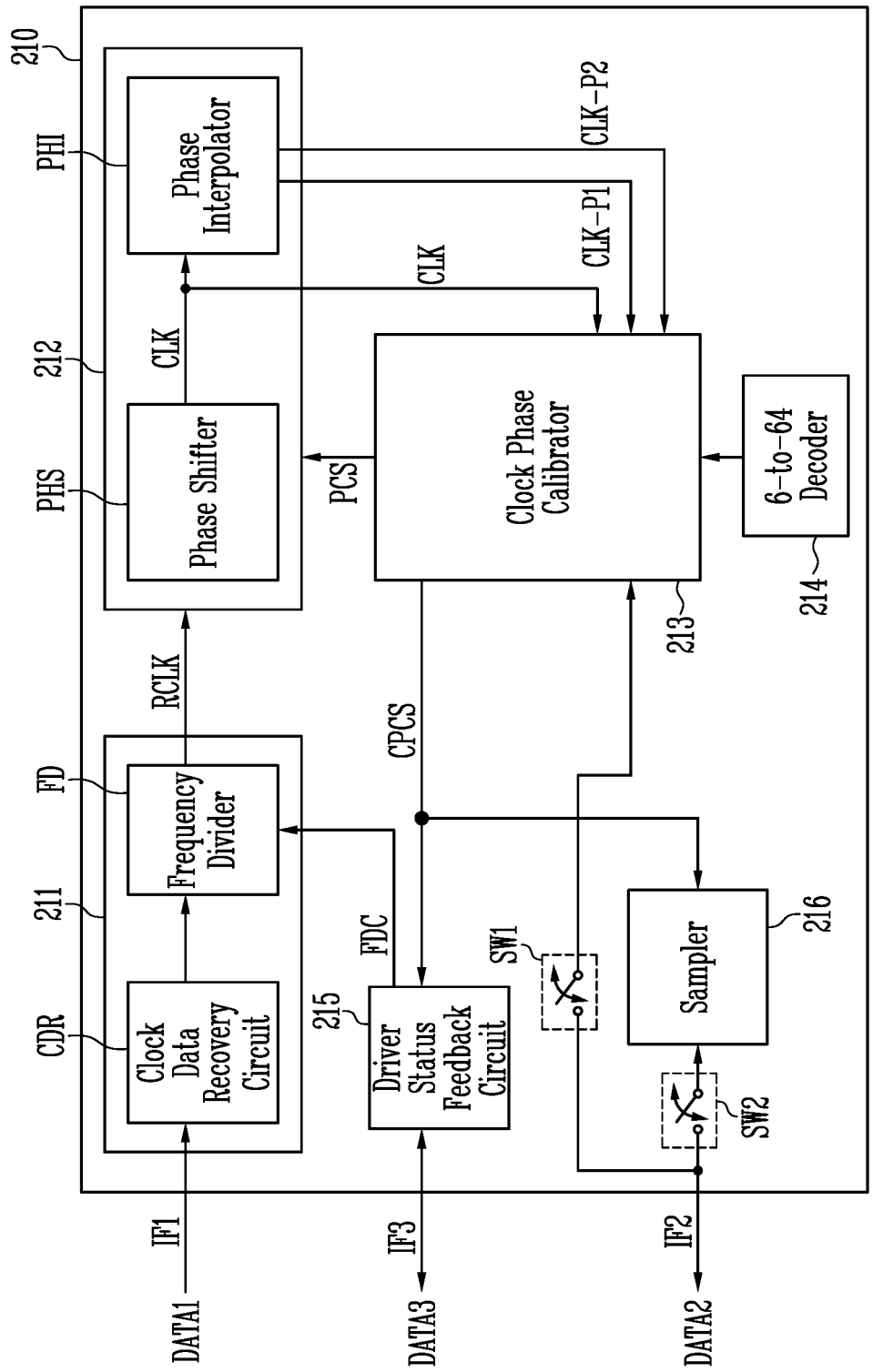
FIG. 4 is a block diagram illustrating an example of the data driving circuit included in the display device of FIG. 1.

FIG. 4 is a block diagram illustrating an example of the data driving circuit 210 included in the display device DD of FIG. 1.

Referring to FIG. 4, the data driving circuit 210 may include a clock recovery circuit 211, a clock generator 212, a clock phase calibrator 213, a decoder 214, a driver status feedback circuit 215 (hereinafter, also referred to as a driver status feedback provider or a feedback provider), and a sampler 216.

The clock recovery circuit 211 may recover a clock signal from the first data signal DATA1, and may output a reference clock signal RCLK based on the recovered clock signal. The clock recovery circuit 211 may include a clock data recovery circuit CDR and a frequency divider FD.

The clock data recovery circuit CDR may recover a clock signal from the first data signal DATA1 received through the first interface IF1.

The frequency divider FD divides the clock signal that is recovered by the clock data recovery circuit CDR, and generates a low-frequency clock signal having a lower frequency than the recovered clock signal. The frequency divider FD may set the frequency of the low-frequency clock signal depending on the value of a frequency divider code FDC that is provided by the feedback provider 215. The frequency divider code FDC will be described later with reference to FIG. 7B.

The clock recovery circuit 211 may output the low-frequency clock signal, generated by the frequency divider FD, and the low-frequency clock signal that is output from the clock recovery circuit 211 is herein referred to as the reference clock signal RCLK.

The clock generator 212 may generate phase conversion clock signals having different phases by shifting the phase of the reference clock signal RCLK. The clock generator 212 may include a phase shifter PHS and a phase interpolator PHI.

The phase shifter PHS may generate a normal clock signal CLK by shifting the phase of the reference clock signal RCLK. In an embodiment, the phase of the normal clock signal CLK may be the same as the phase of the reference clock signal RCLK, or may lead the phase of the reference clock signal RCLK. In an embodiment, the phase difference between the normal clock signal CLK and the reference clock signal RCLK may be gradually changed depending on a phase control signal PCS, and a detailed description thereof will be made later.

The phase interpolator PHI may generate a first phase conversion clock signal CLK-P1 and a second phase conversion clock signal CLK-P2, the phases of which are different from the phase of the normal clock signal CLK, based on the normal clock signal CLK. The phase conversion clock signals may include the normal clock signal CLK, the first phase conversion clock signal CLK-P1, and the second phase conversion clock signal CLK-P2.

The phase of the first phase conversion clock signal CLK-P1 may lead the phase of the normal clock signal CLK. For example, the phase difference between the first phase conversion clock signal CLK-P1 and the normal clock signal CLK may be X degrees (X°).

The phase of the second phase conversion clock signal CLK-P2 may lag behind the phase of the normal clock signal CLK. For example, the phase difference between the normal clock signal CLK and the second phase conversion clock signal CLK-P2 may be Y degrees (Y°). In an embodiment, the phase difference between the first phase conversion clock signal CLK-P1 and the normal clock signal CLK may be equal to the phase difference between the normal clock signal CLK and the second phase conversion clock signal CLK-P2. In other words, the value of X may be equal to the value of Y.

In an embodiment, the phase control signal PCS configured to control the phase of the normal clock signal CLK may be applied to the clock generator 212. The phase control signal PCS may be an m-bit digital signal (m being a natural number).

In an embodiment, the phase difference between the normal clock signal CLK and the reference clock signal RCLK may be gradually changed depending on the phase control signal PCS. In an embodiment, the phase difference between the normal clock signal CLK and the reference clock signal RCLK may gradually increase depending on the phase control signal PCS. For example, the phase control signal PCS is configured with six phase control bits, the six phase control bits may gradually increase from '000000' to '111111' in 64 stages (illustrated in FIG. 6A and FIG. 6B). In this case, as the value of the phase control bits increases from '000000' to '111111', the phase difference between the normal clock signal CLK and the reference clock signal RCLK may gradually increase. In other words, as the phase control bits increase in stages, the phase of the normal clock signal CLK generated by the phase shifter PHS may gradually advance.

Because the first phase conversion clock signal CLK-P1 is set based on the normal clock signal CLK, the phase difference between the first phase conversion clock signal CLK-P1 and the normal clock signal CLK may be constant regardless of the phase difference between the normal clock signal CLK and the reference clock signal RCLK. Similarly, because the second phase conversion clock signal CLK-P2 is set based on the normal clock signal CLK, the phase difference between the normal clock signal CLK and the second phase conversion clock signal CLK-P2 may be constant regardless of the phase difference between the normal clock signal CLK and the reference clock signal RCLK. Accordingly, as the phase control bits increase in stages, the phase of the first phase conversion clock signal CLK-P1 and the phase of the second phase conversion clock signal CLK-P2 may gradually advance.

The clock phase calibrator 213 may detect an edge of the second data signal DATA2 based on the phase conversion clock signals (e.g., the normal clock signal CLK, the first phase conversion clock signal CLK-P1, and the second phase conversion clock signal CLK-P2), and may extract the phase of the second data signal DATA2 based on the edge. The clock phase calibrator 213 may generate a clock phase calibration signal CPCS based on the extracted phase of the second data signal DATA2. The clock phase calibrator 213 may supply the clock phase calibration signal CPCS to the feedback provider 215.

In an embodiment, the clock phase calibrator 213 may supply the phase control signal PCS that is configured to control the phase of the normal clock signal CLK to the clock generator 212. In another embodiment, the phase control signal PCS may be internally generated by the clock generator 212 or may be provided to the clock generator 212 externally from the data driving circuit 210.

The decoder 214 may supply a control signal to the clock phase calibrator 213. The control signal may be used for controlling the clock phase calibrator 213 to sequentially store signals output by an exclusive-OR circuit (e.g., XC in FIG. 5) in a phase register circuit (e.g., PRC in FIG. 5) in the clock phase calibrator 213. A detailed description of the clock phase calibrator 213 and the decoder 214 will be made later with reference to FIG. 5, FIG. 6A and FIG. 6B.

The feedback provider 215 may receive the clock phase calibration signal CPCS from the clock phase calibrator 213 and transmit the clock phase calibration signal CPCS to the timing controller 300 through a third interface IF3. A detailed description of the feedback provider 215 and the third interface IF3 will be made with reference to FIG. 7A and FIG. 7B.

The timing controller 300 (shown in FIGS. 1 and 3A) may generate reference clock phase information for setting the phase of the reference clock signal RCLK based on the clock phase calibration signal CPCS. Accordingly, the phase of the reference clock signal RCLK generated by the clock recovery circuit 211 may be changed depending on the reference clock phase information generated by the timing controller 300. In an embodiment, the first data signal DATA1 may include the reference clock phase information. Referring to FIG. 3A, because the first interface IF1 configured to transmit the first data signal DATA1 couples the timing controller (300 in FIG. 3A) to each of the data driving circuits 210, the reference clock phase information for setting the phase of the reference clock signal RCLK may be different for each of the data driving circuits 210.

The sampler 216 may sample the second data signal DATA2 depending on the reference clock signal RCLK. In an embodiment, the sampler 216 may sample the second data signal DATA2 based on the clock phase calibration signal CPCS. The reference clock signal RCLK may be changed (calibrated) based on the phase of the second data signal DATA2. In an embodiment, each of the data driving circuits 210 may generate sensing data voltages based on the sampling of the second data signal DATA2.

In an embodiment, the data driving circuit 210 may include a first switching element SW1 and a second switching element SW2. The first switching element SW1 may be coupled to the clock phase calibrator 213, and the second switching element SW2 may be coupled to the sampler 216.

The first switching element SW1 is turned on in a first period and transmits the second data signal DATA2 from the second interface IF2 to the clock phase calibrator 213 in the first period. The second switching element SW2 is turned on in a second period, which is different from the first period, and transmits the second data signal DATA2 from the second interface IF2 to the sampler 216 in the second period. Here, the first period may correspond to a clock phase calibration period during which the clock phase calibrator 213 operates, and the second period may correspond to a period during which the display device DD operates normally.

In the first period, the first switching element SW1 is turned on, and the second data signal DATA2 may be supplied to the clock phase calibrator 213. The clock phase calibrator 213 may generate a clock phase calibration signal CPCS in the first period based on the phase of the second data signal DATA2.

In the second period, the second switching element SW2 is turned on, and the second data signal DATA2 may be supplied to the sampler 216. The sampler 216 may sample the second data signal DATA2 depending on the reference clock signal RCLK in the second period, and the reference clock signal RCLK may be changed (calibrated) based on the phase of the second data signal DATA2.

As described above with reference to FIG. 4, the data driving circuit 210 may generate the clock phase calibration signal CPCS based on the phase of the second data signal DATA2, and may sample the second data signal DATA2 depending on the reference clock signal RCLK that may be changed (calibrated) based on the phase of the second data signal DATA2. Accordingly, the display device DD may calibrate a phase of the reference clock signal RCLK such that the phase of the second data signal DATA2 corresponds to the phase of the reference clock signal RCLK, thereby improving transmission characteristic of the signal.

The display device DD eliminates a clock line pair of the second interface IF2 by using the reference clock signal RCLK as the clock signal for sampling the second data signal DATA2, thereby reducing the number of pins coupled and simplifying the interface of the display device DD.

Figure 5:
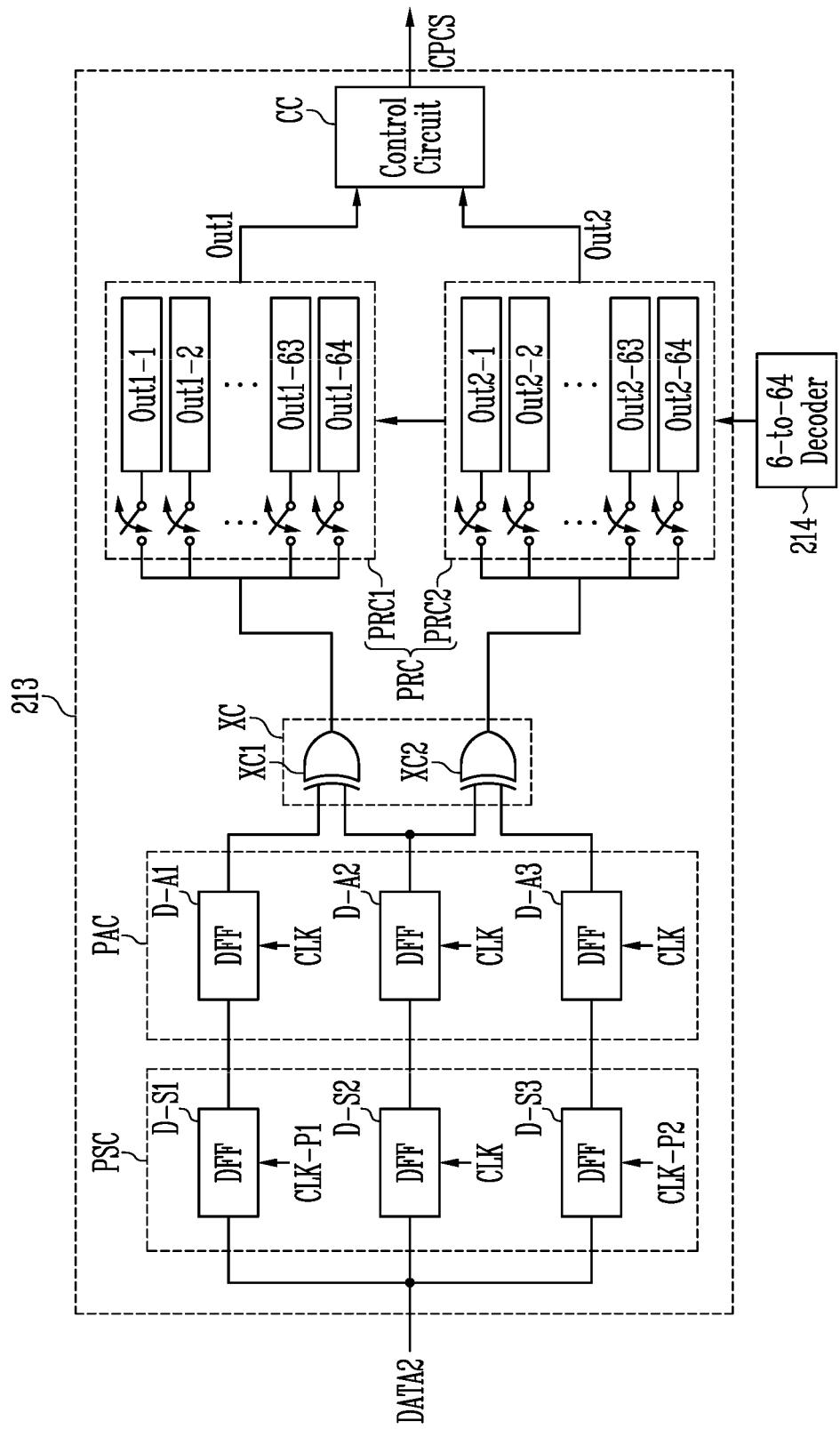
FIG. 5 is a block diagram illustrating an example of the clock phase calibrator included in the data driving circuit of FIG. 4.

FIG. 5 is a block diagram illustrating an example of the clock phase calibrator 213 included in the data driving circuit of FIG. 4.

Referring to FIG. 5, the clock phase calibrator 213 may include a phase sampling circuit PSC, a phase aligning circuit PAC, an exclusive-OR circuit XC, a phase register circuit PRC, and a control circuit CC.

The phase sampling circuit PSC may sample the second data signal DATA2 depending on the phase conversion clock signals including the normal clock signal CLK, the first phase conversion clock signal CLK-P1, and the second phase conversion clock signal CLK-P2.

In an embodiment, the phase sampling circuit PSC may include a first sampling D flip-flop D-S1, a second sampling D flip-flop D-S2, and a third sampling D flip-flop D-S3. The first sampling D flip-flop D-S1 may receive the second data signal DATA2 and the first phase conversion clock signal CLK-P1 and sample the second data signal DATA2 depending on the first phase conversion clock signal CLK-P1. The second sampling D flip-flop D-S2 may receive the second data signal DATA2 and the normal clock signal CLK and sample the second data signal DATA2 depending on the normal clock signal CLK. The third sampling D flip-flop D-S3 may receive the second data signal DATA2 and the second phase conversion clock signal CLK-P2 and sample the second data signal DATA2 depending on the second phase conversion clock signal CLK-P2. In FIG. 5, the phase sampling circuit PSC is illustrated to include three sampling D flip-flops, i.e., D-S1, D-S2 and D-S3, but the number of sampling D flip-flops included in the phase sampling circuit PSC is not limited thereto. For example, the phase sampling circuit PSC may include two sampling D flip-flops or four or more sampling D flip-flops. In other words, the phase sampling circuit PSC samples the second data signal DATA2 using the normal clock signal CLK and at least one phase conversion clock signal and outputs a number of signals to the phase aligning circuit PAC based on the number of sampling D flip-flops.

The phase aligning circuit PAC may align the signals that are output by the phase sampling circuit PSC to have the same phase. In this case, the signals output by the phase sampling circuit PSC may be compared with each other at the same phase.

In an embodiment, the phase aligning circuit PAC may include a first alignment D flip-flop D-A1, a second alignment D flip-flop D-A2, and a third alignment D flip-flop D-A3. The first alignment D flip-flop D-A1 may receive the signal output by the first sampling D flip-flop D-S1 and the normal clock signal CLK and align the signal output by the first sampling D flip-flop D-S1 based on the phase of the normal clock signal CLK. The second alignment D flip-flop D-A2 may receive the signal output by the second sampling D flip-flop D-S2 and the normal clock signal CLK and align the signal output by the second sampling D flip-flop D-S2 based on the phase of the normal clock signal CLK. The third alignment D flip-flop D-A3 may receive the signal output by the third sampling D flip-flop D-S3 and the normal clock signal CLK and align the signal output by the third sampling D flip-flop D-S3 based on the phase of the normal clock signal CLK. In FIG. 5, the phase aligning circuit PAC is illustrated to include three alignment D flip-flops, i.e., D-A1, D-A2 and D-A3, but the number of alignment D flip-flops included in the phase aligning circuit PAC is not limited thereto. For example, the phase aligning circuit PAC may include two alignment D flip-flops or four or more alignment D flip-flops. In other words, the phase aligning circuit PAC aligns the signals output by the phase sampling circuit PSC using the normal clock signal CLK and outputs a number of signals to the exclusive-OR circuit XC based on the number of alignment D flip-flops. In an embodiment, when the number of sampling D flip-flops is p, the number of alignment D flip-flops may also be p (p being a natural number that is equal to or greater than 2).

The exclusive-OR circuit XC may perform an exclusive-OR operation on the signals that are output by the phase aligning circuit PAC.

In an embodiment, the exclusive-OR circuit XC may include a first exclusive-OR circuit XC1 and a second exclusive-OR circuit XC2. In FIG. 5, the exclusive-OR circuit XC is illustrated to include two exclusive-OR circuits, i.e., XC1 and XC2, but the number of exclusive-OR circuits included in the exclusive-OR circuit XC is not limited thereto. For example, the exclusive-OR circuit XC may include one exclusive-OR circuit or three or more exclusive-OR circuits. In an embodiment, when the number of alignment D flip-flops is p, the number of exclusive-OR circuits may be p−1.

In an embodiment, the first exclusive-OR circuit XC1 may perform an exclusive-OR operation on the signal output by the first alignment D flip-flop D-A1 and the signal output by the second alignment D flip-flop D-A2. Similarly, the second exclusive-OR circuit XC2 may perform an exclusive-OR operation on the signal output by the second alignment D flip-flop D-A2 and the signal output by the third alignment D flip-flop D-A3. However, the coupling relationship between the exclusive-OR circuit and the phase aligning circuit PAC is not limited thereto. For example, the first exclusive-OR circuit XC1 may perform an exclusive-OR operation on the signal output by the first alignment D flip-flop D-A1 and the signal output by the third alignment D flip-flop D-A3, and the second exclusive-OR circuit XC2 may perform an exclusive-OR operation on the signal output by the second alignment D flip-flop D-A2 and the signal output by the third alignment D flip-flop D-A3.

The phase register circuit PRC may store data output from the exclusive-OR circuit XC.

In an embodiment, the phase register circuit PRC may include a first phase register circuit PRC1 and a second phase register circuit PRC2. In FIG. 5, the phase register circuit PRC is illustrated to include two phase register circuits, i.e., PRC1 and PRC2, but the number of phase register circuits included in the phase register circuit PRC is not limited thereto. For example, the phase register circuit PRC may include one phase register circuit or three or more phase register circuits. In an embodiment, when the number of exclusive-OR circuits is p−1, the number of phase register circuits may also be p−1.

In an embodiment, the first phase register circuit PRC1 may include a plurality of first count registers Out1-1 to Out1-64. The second phase register circuit PRC2 may include a plurality of second count registers Out2-1 to Out2-64.

In an embodiment, the number of first count registers Out1-1 to Out1-64 may be equal to the number of second count registers Out2-1 to Out2-64. In FIG. 5, each of the number of first count registers Out1-1 to Out1-64 and the number of second count registers Out2-1 to Out2-64 are illustrated to include a total of 64 count registers, but the number of first count registers Out1-1 to Out1-64 and the number of second count registers Out2-1 to Out2-64 are not limited thereto.

In an embodiment, when the phase control signal PCS (shown in FIG. 4) is an m-bit digital signal (m being a natural number), each of the number of first count registers Out1-1 to Out1-64 and the number of second count registers Out2-1 to Out2-64 may be n, in which case the value of n may be equal to the value of $2^m$. For example, the phase control signal PCS configured to control the phase of the normal clock signal CLK may be six bits. Accordingly, each of the number of first count registers Out1-1 to Out1-64 and the number of second count registers Out2-1 to Out2-64 is illustrated as $2^6$, that is, 64.

Depending on the phase control signal PCS, the pieces of data sequentially output by the first exclusive-OR circuit XC1 may be sequentially stored in the first count registers Out1-1 to Out1-64. Similarly, depending on the phase control signal PCS, the pieces of data sequentially output by the second exclusive-OR circuit XC2 may be sequentially stored in the second count registers Out2-1 to Out2-64. As described above with reference to FIG. 4, such sequential storage of the data in the first count registers Out1-1 to Out1-64 and the second count registers Out2-1 to Out2-64 may be controlled by the control signal supplied from the decoder 214.

The control circuit CC compares the data output by the first exclusive-OR circuit XC1 and the data output by the second exclusive-OR circuit XC2 based on the pieces of data that are output by the exclusive-OR circuits XC1 and XC2 and stored in the phase register circuit PRC and extracts an edge of the second data signal DATA2. Accordingly, the control circuit CC may extract the phase of the second data signal DATA2 based on the edge of the second data signal DATA2 and select one of the phase conversion clock signals having a phase corresponding to the phase of the second data signal DATA2 to generate the clock phase calibration signal CPCS.

Figure 6A:
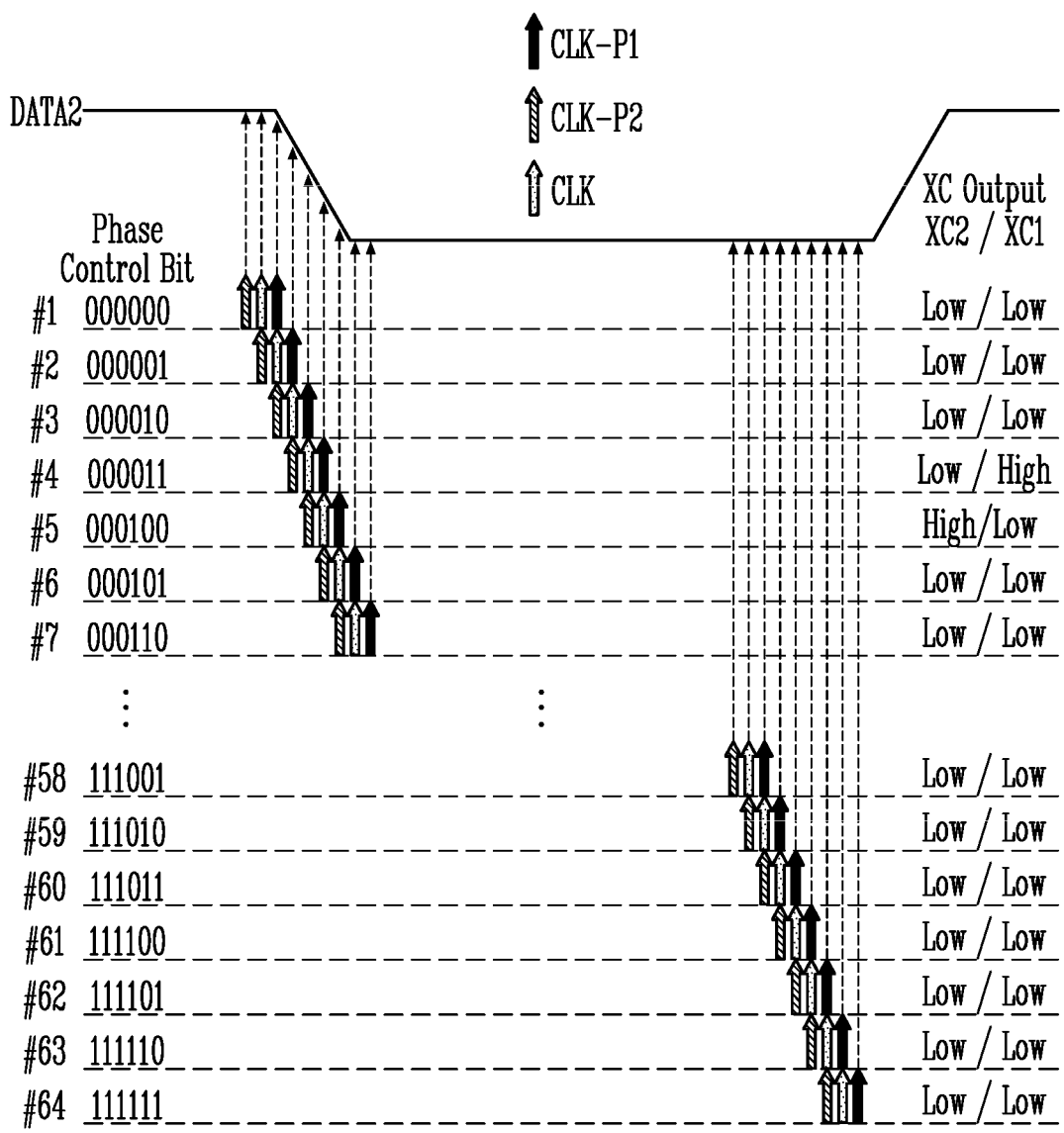
FIG. 6A and FIG. 6B are waveform diagrams for explaining the operation of the clock phase calibrator of FIG. 5.
Figure 6B:
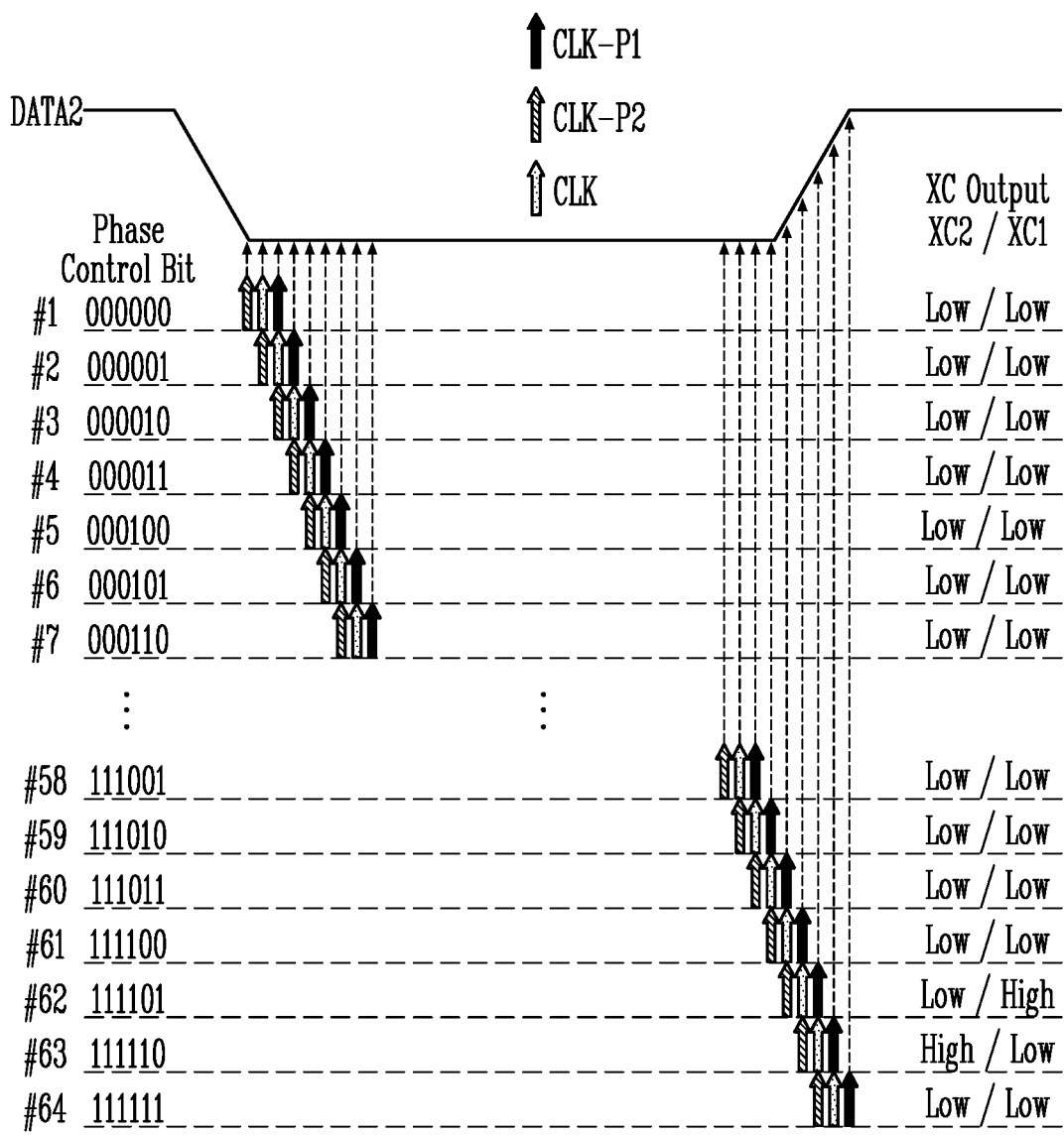

FIG. 6A and FIG. 6B are waveform diagrams for explaining the operation of the clock phase calibrator 213 of FIG. 5.

In FIG. 6A and FIG. 6B, the second data signals DATA2 are illustrated to have different phases. For example, the phase of the second data signal DATA2 in FIG. 6A may lead the phase of the second data signal DATA2 in FIG. 6B. As described above with reference to FIG. 3B, the phase of the second data signal DATA2 may be different depending on the length of each of the branches BR of the second interface IF2 that is coupled to the respective data driving circuits 210.

For the convenience of description, the phase control bits included in the phase control signal PCS is assumed to have six bits. The phase control bits may gradually increase from '000000' to '111111' in 64 stages.

As described above with reference to FIG. 4, when the value of the phase control bits increases from '000000' to '111111', each of the phase of the normal clock signal CLK, the phase of the first phase conversion clock signal CLK-P1, and the phase of the second phase conversion clock signal CLK-P2 may gradually advance.

The second data signal DATA2 may have a first voltage level and a second voltage level. The first voltage level may be higher than the second voltage level. Accordingly, the phase sampling circuit PSC may sample the second data signal DATA2 having the first voltage level as '1'. On the other hand, the phase sampling circuit PSC may sample the second data signal DATA2 having the second voltage level as '0'.

Referring to FIG. 5 and FIG. 6A, when the value of the phase control bits is '000000', '000001', or '000010', the phase sampling circuit PSC may sample the second data signal DATA2 having the first voltage level depending on each of the normal clock signal CLK, the first phase conversion clock signal CLK-P1, and the second phase conversion clock signal CLK-P2. Accordingly, the phase sampling circuit PSC may sample the value as '1' depending on each of the normal clock signal CLK, the first phase conversion clock signal CLK-P1, and the second phase conversion clock signal CLK-P2. Therefore, all of the digital signals applied to the first exclusive-OR circuit XC1 and the second exclusive-OR circuit XC2 are '1's, and thus all of the digital signals output by the first exclusive-OR circuit XC1 and the second exclusive-OR circuit XC2 may be '0's (low).

When the value of the phase control bits is '000011', the phase sampling circuit PSC may sample the second data signal DATA2 having the first voltage level depending on each of the normal clock signal CLK and the second phase conversion clock signal CLK-P2. Accordingly, the phase sampling circuit PSC may sample the value as '1' depending on each of the normal clock signal CLK and the second phase conversion clock signal CLK-P2. On the other hand, the phase sampling circuit PSC may sample the second data signal DATA2 having the second voltage level depending on the first phase conversion clock signal CLK-P1. Accordingly, the phase sampling circuit PSC may sample the value as '0' depending on the first phase conversion clock signal CLK-P1. Therefore, the digital signals applied to the first exclusive-OR circuit XC1 are '0' and '1', and thus the digital signal output by the first exclusive-OR circuit XC1 may be '1' (high). On the other hand, all of the digital signals applied to the second exclusive-OR circuit XC2 are '1's, and thus the digital signal output by the second exclusive-OR circuit XC2 may be '0' (low).

When the value of the phase control bits is '000100', the phase sampling circuit PSC may sample the second data signal DATA2 having the first voltage level depending on the second phase conversion clock signal CLK-P2. Accordingly, the phase sampling circuit PSC may sample the value as '1' depending on the second phase conversion clock signal CLK-P2. On the other hand, the phase sampling circuit PSC may sample the second data signal DATA2 having the second voltage level depending on each of the normal clock signal CLK and the first phase conversion clock signal CLK-P1. Accordingly, the phase sampling circuit PSC may sample the value as '0' depending on each of the normal clock signal CLK and the first phase conversion clock signal CLK-P1. Therefore, all of the digital signals applied to the first exclusive-OR circuit XC1 are '0's, and thus the digital signal output by the first exclusive-OR circuit XC1 may be '0' (low). On the other hand, the digital signals applied to the second exclusive-OR circuit XC2 are '0' and '1', and thus the digital signal output by the second exclusive-OR circuit XC2 may be '1' (high).

When the value of the phase control bits falls within a range from '000101' to '111111', the phase sampling circuit PSC may sample the second data signal DATA2 having the second voltage level depending on each of the normal clock signal CLK, the first phase conversion clock signal CLK-P1, and the second phase conversion clock signal CLK-P2. Accordingly, the phase sampling circuit PSC may sample the value as '0' depending on each of the normal clock signal CLK, the first phase conversion clock signal CLK-P1, and the second phase conversion clock signal CLK-P2. Therefore, all of the digital signals applied to the first exclusive-OR circuit XC1 and the second exclusive-OR circuit XC2 are '0's, and thus all of the digital signals output by the first exclusive-OR circuit XC1 and the second exclusive-OR circuit XC2 may be '0's (low).

Referring to FIG. 5 and FIG. 6B, when the value of the phase control bits falls within a range from '000000' to '111100', the phase sampling circuit PSC may sample the second data signal DATA2 having the second voltage level depending on each of the normal clock signal CLK, the first phase conversion clock signal CLK-P1, and the second phase conversion clock signal CLK-P2. Accordingly, the phase sampling circuit PSC may sample the value as '0' depending on each of the normal clock signal CLK, the first phase conversion clock signal CLK-P1, and the second phase conversion clock signal CLK-P2. Therefore, all of the digital signals applied to the first exclusive-OR circuit XC1 and the second exclusive-OR circuit XC2 are '0's, and thus all of the digital signals output by the first exclusive-OR circuit XC1 and the second exclusive-OR circuit XC2 may be '0's (low).

When the value of the phase control bits is '111101', the phase sampling circuit PSC may sample the second data signal DATA2 having the second voltage level depending on each of the normal clock signal CLK and the second phase conversion clock signal CLK-P2. Accordingly, the phase sampling circuit PSC may sample the value as '0' depending on each of the normal clock signal CLK and the second phase conversion clock signal CLK-P2. On the other hand, the phase sampling circuit PSC may sample the second data signal DATA2 having the first voltage level depending on the first phase conversion clock signal CLK-P1. Accordingly, the phase sampling circuit PSC may sample the value as '1' depending on the first phase conversion clock signal CLK-P1. Therefore, the digital signals applied to the first exclusive-OR circuit XC1 are '0' and '1', and thus the digital signal output by the first exclusive-OR circuit XC1 may be '1' (high). On the other hand, all of the digital signals applied to the second exclusive-OR circuit XC2 are '0's, and thus the digital signal output by the second exclusive-OR circuit XC2 may be '0' (low).

When the value of the phase control bits is '111110', the phase sampling circuit PSC may sample the second data signal DATA2 having the second voltage level depending on the second phase conversion clock signal CLK-P2. Accordingly, the phase sampling circuit PSC may sample the value as '0' depending on the second phase conversion clock signal CLK-P2. On the other hand, the phase sampling circuit PSC may sample the second data signal DATA2 having the first voltage level depending on each of the normal clock signal CLK and the first phase conversion clock signal CLK-P1. Accordingly, the phase sampling circuit PSC may sample the value as '1' depending on each of the normal clock signal CLK and the first phase conversion clock signal CLK-P1. Therefore, all of the digital signals applied to the first exclusive-OR circuit XC1 are '1's, and thus the digital signal output by the first exclusive-OR circuit XC1 may be '0' (low). On the other hand, the digital signals applied to the second exclusive-OR circuit XC2 are '0' and '1', and thus the digital signal output by the second exclusive-OR circuit XC2 may be '1' (high).

When the value of the phase control bits is '111111', the phase sampling circuit PSC may sample the second data signal DATA2 having the first voltage level depending on each of the normal clock signal CLK, the first phase conversion clock signal CLK-P1, and the second phase conversion clock signal CLK-P2. Accordingly, the phase sampling circuit PSC may sample the value as '1' depending on each of the normal clock signal CLK, the first phase conversion clock signal CLK-P1, and the second phase conversion clock signal CLK-P2. Therefore, all of the digital signals applied to the first exclusive-OR circuit XC1 and the second exclusive-OR circuit XC2 are '1's, and thus all of the digital signals output by the first exclusive-OR circuit XC1 and the second exclusive-OR circuit XC2 may be '0's (low).

Referring to FIG. 5, FIG. 6A, and FIG. 6B, the digital signals output by the first exclusive-OR circuit XC1 may be sequentially stored in the first count registers Out1-1 to Out1-64, and the digital signals output by the second exclusive-OR circuit XC2 may be sequentially stored in the second count registers Out2-1 to Out2-64. For example, when the value of the phase control bits is '000000', the digital signals output by the first exclusive-OR circuit XC1 and the second exclusive-OR circuit XC2 may be stored in the 1-1-th count register Out1-1 and the 2-1-th count register Out2-1, respectively. Similarly, when the value of the phase control bits is '000001', the digital signals output by the first exclusive-OR circuit XC1 and the second exclusive-OR circuit XC2 may be stored in the 1-2-th count register Out1-2 and the 2-2-th count register Out2-2, respectively.

The control circuit CC reads the pieces of data Out1 stored in the first count registers Out1-1 to Out1-64 and the pieces of data Out2 stored in the second count registers Out2-1 to Out2-64. The control circuit CC compares the output of the first exclusive-OR circuit XC1 with the output of the second exclusive-OR circuit XC2 based on the pieces of data Out1 stored in the first count registers Out1-1 to Out1-64 and the pieces of data Out2 stored in the second count registers Out2-1 to Out2-64 and extracts an edge of the second data signal DATA2.

In an embodiment, when the output of the first exclusive-OR circuit XC1 is different from the output of the second exclusive-OR circuit XC2, the control circuit CC may extract an edge of the second data signal DATA2 based on the phase control bits. In the example of FIG. 6A, because the output of the first exclusive-OR circuit XC1 is different from the output of the second exclusive-OR circuit XC2 when the phase control bits are '000011' or '000100', the control circuit CC may extract an edge of the second data signal DATA2 based on the phase control bits '000011' and '000100'. In the example of FIG. 6B, because the output of the first exclusive-OR circuit XC1 is different from the output of the second exclusive-OR circuit XC2 when the phase control bits are '111101' or '111110', the control circuit CC may extract an edge of the second data signal DATA2 based on the phase control bits '111101' and '111110'.

The control circuit CC may determine a falling edge and/or a rising edge of the second data signal DATA2 based on the extracted edge of the second data signal DATA2. Based on the extracted falling edge and/or rising edge, the control circuit CC may extract a phase of the second data signal DATA2. Accordingly, the control circuit CC may extract the phase of the second data signal DATA2 based on the extracted edge of the second data signal DATA2.

The control circuit CC may select one of the phase conversion clock signals (e.g., the normal clock signal CLK, the first phase conversion clock signal CLK-P1, and the second phase conversion clock signal CLK-P2) having a phase corresponding to the extracted phase of the second data signal DATA2. In an embodiment, the selected phase conversion clock signal may be the normal clock signal CLK.

In an embodiment, the phase of the selected normal clock signal CLK may correspond to a median value of the phases of the normal clock signal CLK having the phase corresponding to the phase of the second data signal DATA2.

For example, referring to FIG. 6A, when the phase control bits are '000011' and '000100', the control circuit CC may determine that the normal clock signal CLK has a phase corresponding to the edge of the second data signal DATA2. Accordingly, the control circuit CC may select the normal clock signal CLK that has a phase corresponding to a median value of the phases of the normal clock signal CLK in the range of the phase control bits from '000101' to '111111'.

In another example, referring to FIG. 6B, when the phase control bits are '111101' and '111110', the control circuit CC may determine that the normal clock signal CLK has a phase corresponding to the edge of the second data signal DATA2. Accordingly, the control circuit CC may select the normal clock signal CLK that has a phase corresponding to a median value of the phases of the normal clock signal CLK in the rage of the phase control bits from '000000' to '111100'.

However, the operation of selecting one of the phase conversion clock signals is not limited to the examples described above. For example, in FIG. 6A, the normal clock signal CLK having a phase that corresponds to the phase control bits '100000' may be selected, and in FIG. 6B, the normal clock signal CLK having a phase that corresponds to the phase control bits '100100' may be selected.

The control circuit CC may generate the clock phase calibration signal CPCS based on a phase conversion clock signal that is selected by the control circuit CC. In an embodiment, the control circuit CC may generate a clock phase calibration signal for changing (calibrating) the phase of the reference clock signal RCLK to correspond to the phase of the selected phase conversion clock signal.

The control circuit CC may supply the clock phase calibration signal CPCS to the feedback provider 215. A detailed description of the feedback provider 215 will be made later with reference to FIG. 7A and FIG. 7B.

As described above with reference to FIG. 5, FIG. 6A, and FIG. 6B, the clock phase calibrator 213 may extract an edge and a phase of the second data signal DATA2 for each of the data driving circuits 210, and may generate a clock phase calibration signal CPCS based on the phase. Accordingly, the clock phase calibrator 213 may generate respective clock phase calibration signals CPCS for the data driving circuits 210 based on the phases of the second data signal DATA2 that may be different for the respective data driving circuits 210 depending on a length of the branches BR (shown in FIG. 3B) of the second interface IF2.

Figure 7A:
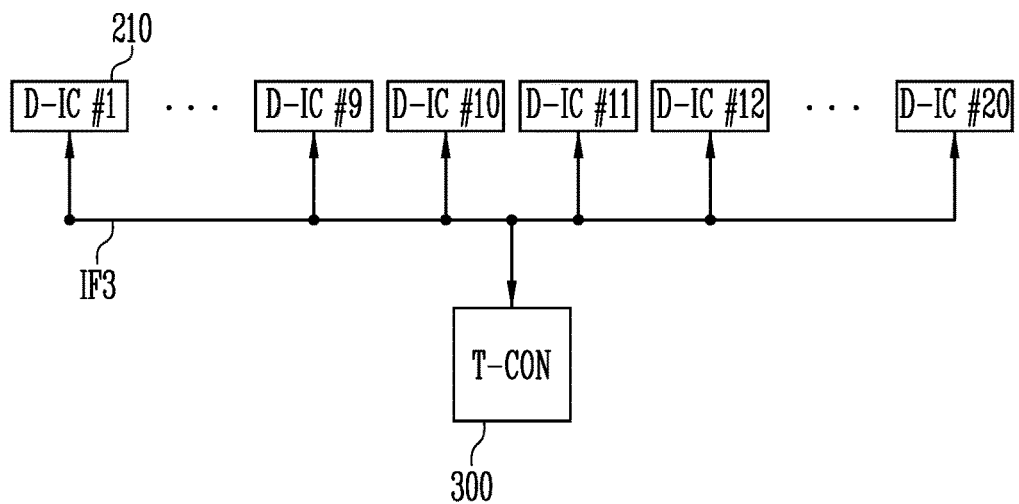
FIG. 7A is a diagram illustrating an example of a third interface that couples the timing controller to the data driving circuits included in the display device of FIG. 1.

FIG. 7A is a diagram illustrating an example of the third interface IF3 that couples the timing controller 300 to the data driving circuits 210 included in the display device DD of FIG. 1.

Referring to FIG. 7A, the third interface IF3 may couple the timing controller 300 to the data driving circuits 210. The third interface IF3 may include a single line coupled to the timing controller 300 and multiple lines that diverge from the single line and are coupled to the respective ones of the data driving circuits 210.

The timing controller 300 may supply the frequency divider code FDC (shown in FIG. 4) to the data driving circuits 210 through the third interface IF3. The data driving circuits 210 may receive the frequency divider code FDC through the third interface IF3. More specifically, the feedback provider 215 may supply the frequency divider code FDC to the frequency divider FD included in the clock recovery circuit 211.

The frequency divider code FDC may be set such that the frequency of the reference clock signal RCLK corresponds to the frequency of the second data signal DATA2. The clock embedded in the first data signal DATA1 may have a higher frequency than the second data signal DATA2. Accordingly, the frequency divider FD divides the frequency of the clock signal that is provided from the clock data recovery circuit CDR depending on the frequency divider code FDC, and generates a low-frequency clock signal having a lower frequency than the clock signal recovered by the clock data recovery circuit CDR.

In an embodiment, the timing controller 300 may supply a calibration enable code Cal_En (shown in FIG. 7B) to the data driving circuits 210 through the third interface IF3. The feedback provider 215 may supply a calibration enable signal corresponding to the calibration enable code Cal_En to the clock phase calibrator 213, the first switching element SW1, and the second switching element SW2.

As described above with reference to FIG. 4, the clock phase calibrator 213 may be controlled to operate in the first period in response to the calibration enable signal. Also, in response to the calibration enable signal, the first switching element SW1 may be turned on, but the second switching element SW2 may be turned off in the first period. According to an embodiment, the calibration enable code Cal_En may be applied to the data driving circuits 210 only in the first period. Accordingly, in the first period, the second data signal DATA2 may be supplied to the clock phase calibrator 213, but it may not be supplied to the sampler 216.

In an embodiment, the clock phase calibrator 213 may generate a calibration disable signal and supply the same to the feedback provider 215 at the time of generating the clock phase calibration signal CPCS. The feedback provider 215 may supply a calibration disable code Cal_Dis (shown in FIG. 7B) that corresponds to the calibration disable signal to the timing controller 300 through the third interface IF3.

Further, the feedback provider 215 may supply the calibration disable signal to the first switching element SW1 and the second switching element SW2.

In an embodiment, the calibration disable signal may have a value that is different from the value of the calibration enable signal.

As described above with reference to FIG. 4, the timing controller 300 may be controlled to output the second data signal DATA2 as a sensing data signal in the second period in response to the calibration disable signal. Also, in response to the calibration disable signal, the first switching element SW1 may be turned off, but the second switching element SW2 may be turned on in the second period. According to an embodiment, the calibration disable signal may be applied to the first switching element SW1 and the second switching element SW2 only in the second period. Accordingly, in the second period, the second data signal DATA2 may be supplied to the sampler 216, but it may not be supplied to the clock phase calibrator 213.

The clock phase calibrator 213 may supply the clock phase calibration signal CPCS to the feedback provider 215. The feedback provider 215 may supply a clock phase calibration code CPCC (shown in FIG. 7B) that corresponds to the clock phase calibration signal CPCS to the timing controller 300 through the third interface IF3.

The third data signal DATA3 that is transmitted through the third interface IF3 may include frequency divider code FDC, the calibration enable code Cal_En, the calibration disable code Cal_Dis, and the clock phase calibration code CPCC.

Figure 7B:
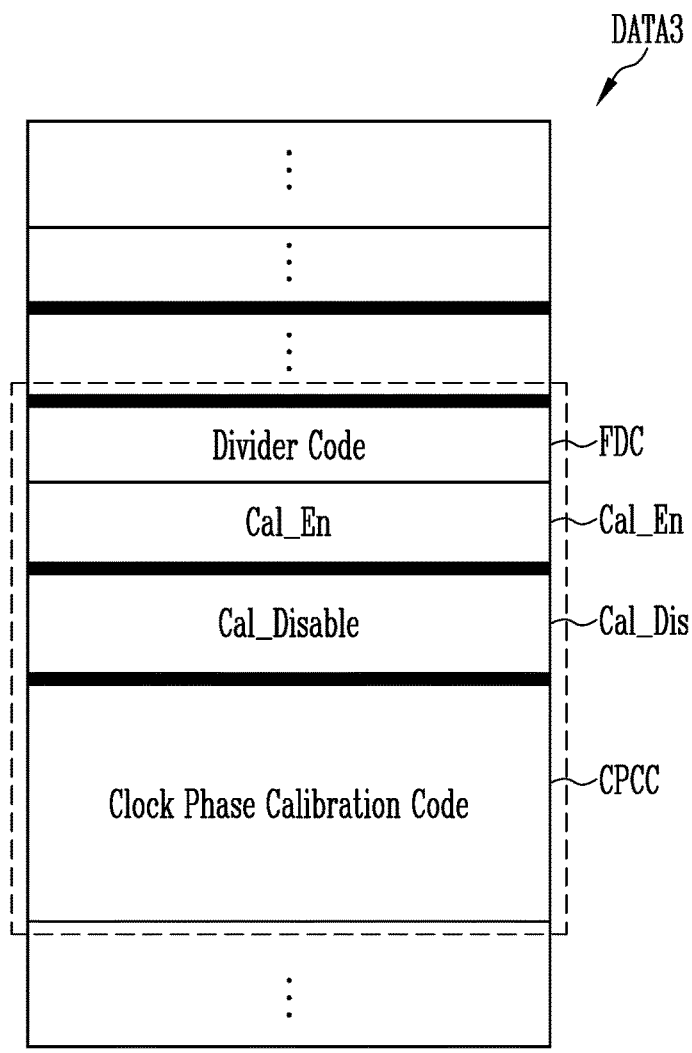
FIG. 7B is a diagram illustrating an example of a third data signal transmitted through the third interface of FIG. 7A.

FIG. 7B is a diagram illustrating an example of the third data signal transmitted through the third interface of FIG. 7A.

Referring to FIG. 7A and FIG. 7B, the third data signal DATA3 transmitted through the third interface IF3 may include various driver status feedback signals. The driver status feedback signals may include feedback signals that represent an operational state of the data driving circuits 210 (e.g., the temperature of the data driving circuits 210, and the like).

Generally, the interface configured to transmit driver status feedback signals may include one or more unassigned bits. The display device DD may use the unassigned bits in an existing interface that is configured to transmit the driver status feedback signals, and transfer an additional signal between the timing controller 300 and the data driving circuits 210.

Referring to FIG. 7B, the third data signal DATA3 may include the frequency divider code FDC, the calibration enable code Cal_En, the calibration disable code Cal_Dis, and the clock phase calibration code CPCC.

In an embodiment, the frequency divider code FDC, the calibration enable code Cal_En, and the calibration disable code Cal_Dis may correspond to signal codes that are common to the data driving circuits 210. Therefore, each of the frequency divider code FDC, the calibration enable code Cal_En, and the calibration disable code Cal_Dis may be assigned with one bit and transmitted to the data driving circuits 210 through the third interface IF3.

In an embodiment, the clock phase calibration code CPCC may be different for the respective ones of the data driving circuits 210. Accordingly, the clock phase calibration code CPCC may be assigned with a number of bits based on the number of the data driving circuits 210 and transmitted to a corresponding one of the data driving circuits 210 through the third interface IF3.

As described above with reference to FIG. 7A and FIG. 7B, the display device DD may transfer each of the frequency divider code FDC, the calibration enable code Cal_En, the calibration disable code Cal_Dis, and the clock phase calibration code CPCC between the timing controller 300 and the data driving circuits 210 using an existing interface (e.g., the third interface IF3) rather than additionally configuring and using a separate interface.

FIG. 8 is a diagram illustrating an example of a data package transmitted between the timing controller 300 and the data driver 200 included in the display device DD of FIG. 1.

Referring to FIG. 8, the 1-1-th interface IF1-1 and the 1-2-th interface IF1-2 may refer to the neighboring two lines, among the multiple lines of the first interface IF1 shown in FIG. 3A. The 1-1-th interface IF1-1 and the 1-2-th interface IF1-2 may be coupled to the different data driving circuits 210.

Each of the 1-1-th interface IF1-1 and the 1-2-th interface IF1-2 may include a start-of-line signal SOL, pixel data, a horizontal blanking period signal HBP, and phase analysis code Phase.

The start-of-line signal SOL may represent that data corresponding to a single line is transmitted. The pixel data may include actual image information for generating data voltages to be supplied to the display panel DP. The horizontal blanking period signal HBP may refer to a standby time for outputting the pixel data to the next frame.

The phase analysis code Phase may control the operation of the clock phase calibrator 213. The clock phase calibrator 213 may extract a phase of the second data signal DATA2 in response to the phase analysis code Phase, and may generate the clock phase calibration signal CPCS. For example, when the phase analysis code Phase has a first value H, the clock phase calibrator 213 may generate the clock phase calibration signal CPCS and supply the clock phase calibration signal CPCS to the feedback provider 215. In another example, when the phase analysis code Phase has a second value L that is different from the first value H, the clock phase calibrator 213 may not perform the operation of generating a clock phase calibration signal CPCS, or may not supply the clock phase calibration signal CPCS to the feedback provider 215.

In an embodiment, the calibration enable signal is commonly supplied to the data driving circuits 210, and may control the clock phase calibrator 213 to operate in the first period. The phase analysis code Phase is supplied to each of the data driving circuits 210 through the 1-1-th interface IF1-1 and the 1-2-th interface IF1-2 that are coupled to the data driving circuits 210, and may control the data driving circuits 210 to sequentially perform a clock phase calibration operation.

Referring to FIG. 8, the 1-1-th interface IF1-1 transmits the phase analysis code having the first value H (Phase=H). Accordingly, during six horizontal periods 6H, the 1-2-th interface IF1-2 may transmit the phase analysis code having the second value L (Phase=L).

When the data driving circuits 210 are not able to simultaneously generate the clock phase calibration signal CPCS, the display device DD may adjust the phase analysis code Phase with respect to time, as described above, thereby sequentially generating the clock phase calibration signal CPCS for each of the data driving circuits 210.

The clock phase calibrator 213 may generate the clock phase calibration signal CPCS and supply the same to the feedback provider 215, and the feedback provider 215 may supply clock phase calibration codes CPCC[0], CPCC[1], CPCC[2], CPCC[3], CPCC[4] and CPCC[5] that correspond to the clock phase calibration signal CPCS to the timing controller 300 through the third interface IF3.

As described above with reference to FIG. 8, the display device DD may sequentially generate the clock phase calibration signal CPCS for each of the data driving circuits 210 using the phase analysis code Phase, and may supply the clock phase calibration codes CPCC[0], CPCC[1], CPCC[2], CPCC[3], CPCC[4] and CPCC[5] that correspond to the clock phase calibration signal CPCS to the timing controller 300 through the third interface IF3.

A display device and a method of driving the display device according to embodiments of the present disclosure calibrate a phase of a clock signal using the clock phase calibration signal that has a phase corresponding to the phase of the clock signal, thereby improving transmission characteristic of the signal.

Further, a display device and a method of driving the display device according to embodiments of the present disclosure eliminate a clock line pair of an interface configured to supply a sensing data signal to a data driver, thereby decreasing the number of pins to be coupled and simplifying the interface of the display device.

The drawings and the detailed description of the present disclosure are examples for the present disclosure and are provided for illustrative purpose, rather than limiting or restricting the scope of the present disclosure. Therefore, it will be appreciated to those skilled in the art that various modifications may be made, and other embodiments are available. Accordingly, the scope of the present disclosure should be determined by the spirit and scope of the appended claims.

What is claimed is:

1. A display device, comprising:
 a display panel including pixels;
 data driving circuits configured to generate data voltages based on a first data signal and to supply the data voltages to the pixels; and
 a timing controller configured to interface with each of the data driving circuits through a first interface and further configured to interface in common with data driving circuits through a second interface,
 wherein the timing controller transmits the first data signal to the data driving circuits through the first interface, and transmits a second data signal to the data driving circuits through the second interface,
 wherein each of the data driving circuits comprises:
 a clock recovery circuit configured to recover a clock signal from the first data signal, generate a recovered clock signal, and generate a reference clock signal based on the recovered clock signal;

a clock generator configured to generate phase conversion clock signals having different phases by shifting a phase of the reference clock signal; and a clock phase calibrator configured to extract an edge of the second data signal based on the second data signal and the phase conversion clock signals, extract a phase of the second data signal based on the edge, and generate a clock phase calibration signal based on the phase of the second data signal, wherein the phase of the reference clock signal is changed in response to the clock phase calibration signal.

2. The display device according to claim 1, wherein the clock recovery circuit comprises:

a clock data recovery circuit configured to generate the recovered clock signal from the first data signal; and a frequency divider configured to generate a low-frequency clock signal having a frequency that is lower than a frequency of the recovered clock signal by dividing the recovered clock signal and to output the low-frequency clock signal as the reference clock signal.

3. The display device according to claim 1, wherein the clock generator comprises:

a phase shifter configured to generate a normal clock signal by shifting the phase of the reference clock signal; and a phase interpolator configured to generate a first phase conversion clock signal and a second phase conversion clock signal that have phases that are different from a phase of the normal clock signal, wherein the normal clock signal, the first phase conversion clock signal, and the second phase conversion clock signal are included in the phase conversion clock signals.

4. The display device according to claim 3, wherein a first phase of the first phase conversion clock signal leads the phase of the normal clock signal, and a second phase of the second phase conversion clock signal lags behind the phase of the normal clock signal.

5. The display device according to claim 4, wherein a first phase difference between the first phase conversion clock signal and the normal clock signal is equal to a second phase difference between the normal clock signal and the second phase conversion clock signal.

6. The display device according to claim 3, wherein the phase shifter controls the phase of the normal clock signal using a phase control signal, and the phase control signal is an m-bit digital signal, where m is a natural number.

7. The display device according to claim 6, wherein the clock phase calibrator comprises:

a phase sampling circuit including a first sampling D flip-flop configured to generate a first sampling output by sampling the second data signal depending on the first phase conversion clock signal, a second sampling D flip-flop configured to generate a second sampling output by sampling the second data signal depending on the normal clock signal, and a third sampling D flip-flop configured to generate a third sampling output by sampling the second data signal depending on the second phase conversion clock signal;

a phase aligning circuit including a first alignment D flip-flop configured to generate a first alignment output by aligning the first sampling output of the first sampling D flip-flop depending on the normal clock signal, a second alignment D flip-flop configured to generate a second alignment output by aligning the second alignment output of the second sampling D flip-flop depending on the normal clock signal, and a third alignment D flip-flop configured to generate a third alignment output by aligning the third alignment output of the third sampling D flip-flop depending on the normal clock signal;

an exclusive-OR circuit configured to receive the first alignment output, the second alignment output, and the third alignment output of the phase aligning circuit; and a phase register circuit configured to store data output from the exclusive-OR circuit.

8. The display device according to claim 7, wherein the exclusive-OR circuit comprises:

a first exclusive-OR circuit configured to receive the first alignment output of the first alignment D flip-flop and the second alignment output of the second alignment D flip-flop; and a second exclusive-OR circuit configured to receive the second alignment output of the second alignment D flip-flop and the third alignment output of the third alignment D flip-flop.

9. The display device according to claim 8, wherein the phase register circuit comprises:

n first count registers configured to sequentially store a first output of the first exclusive-OR circuit, where n is a natural number that is equal to or greater than 2; and n second count registers configured to sequentially store a second output of the second exclusive-OR circuit, wherein n is equal to a value of $2^m$.

10. The display device according to claim 9, wherein the clock phase calibrator further comprises:

a control circuit configured to extract the edge of the second data signal by comparing the first output of the first exclusive-OR circuit with the second output of the second exclusive-OR circuit based on pieces of phase data stored in the n first count registers and the n second count registers, extract the phase of the second data signal based on the edge, select one of the phase conversion clock signals having a phase corresponding to the phase of the second data signal, and generate the clock phase calibration signal based on a selected phase conversion clock signal among the phase conversion clock signals.

11. The display device according to claim 10, wherein a phase of the selected phase conversion clock signal is a median value of phases of the phase conversion clock signals that have a phase corresponding to the phase of the second data signal.

12. The display device according to claim 1, wherein the data driving circuits are coupled to the timing controller through a third interface that is different from the first interface and the second interface, and transmit the clock phase calibration signal to the timing controller through the third interface.

13. The display device according to claim 1, wherein:

the first data signal includes reference clock phase information for determining the phase of the reference clock signal, the timing controller changes the reference clock phase information based on the clock phase calibration signal, and the phase of the reference clock signal is changed based on the reference clock phase information that is changed by the timing controller.

14. The display device according to claim 1, wherein each of the data driving circuits further comprises a sampler configured to sample the second data signal depending on the reference clock signal.

15. The display device according to claim 14, wherein each of the data driving circuits further comprises:
a first switching element coupled to the clock phase calibrator; and
a second switching element coupled to the sampler,
wherein the first switching element is turned on in a first period and transmits the second data signal to the clock phase calibrator in the first period, and
wherein the second switching element is turned on in a second period that is different from the first period, and transmits the second data signal to the sampler in the second period.

16. A method of driving a display device, comprising:
transmitting a first data signal from a timing controller to each of data driving circuits through a first interface;
transmitting a second data signal from the timing controller to the data driving circuits through a second interface that is different from the first interface;
recovering a clock signal from the first data signal and generating a reference clock signal based on the clock signal;
generating phase conversion clock signals having different phases by shifting a phase of the reference clock signal;
extracting an edge of the second data signal based on the second data signal and the phase conversion clock signals;
extracting a phase of the second data signal based on the edge and generating a clock phase calibration signal based on the phase of the second data signal; and
changing the phase of the reference clock signal in response to the clock phase calibration signal.

17. The method according to claim 16, wherein generating the reference clock signal comprises:
recovering the clock signal from the first data signal using a clock data recovery circuit;
generating a low-frequency clock signal having a frequency that is lower than a frequency of the recovered clock signal by dividing the recovered clock signal using a frequency divider; and
outputting the low-frequency clock signal as the reference clock signal.

18. The method according to claim 16, wherein generating the phase conversion clock signals comprises:
generating a normal clock signal by shifting the phase of the reference clock signal using a phase shifter; and
generating a first phase conversion clock signal and a second phase conversion clock signal that have phases that are different from a phase of the normal clock signal using a phase interpolator,
wherein the normal clock signal, the first phase conversion clock signal, and the second phase conversion clock signal are included in the phase conversion clock signals.

19. The method according to claim 18, wherein:
extracting the edge of the second data signal comprises:
generating a first sampling output, a second sampling output, and a third sampling output by respectively sampling the second data signal depending on the normal clock signal, the first phase conversion clock signal, and the second phase conversion clock signal using a phase sampling circuit;
generating a first alignment output, a second alignment output, and a third alignment output by respectively aligning the first sampling output, the second sampling output, and the third sampling output of the phase sampling circuit depending on the normal clock signal using a phase aligning circuit;
performing an exclusive-OR operation on the first alignment output, the second alignment output, and the third alignment output of the phase aligning circuit using an exclusive-OR circuit;
storing data output from the exclusive-OR circuit in a phase register circuit; and
extracting the edge of the second data signal by comparing output of the exclusive-OR circuit using a control circuit, and
generating the clock phase calibration signal comprises:
extracting the phase of the second data signal based on the edge and selecting one of the phase conversion clock signals having a phase corresponding to the phase of the second data signal; and
generating the clock phase calibration signal based on a selected phase conversion clock signal among the phase conversion clock signals.

20. The method according to claim 16, further comprising:
transmitting, by the data driving circuit, the clock phase calibration signal to the timing controller through a third interface that is different from the first interface and the second interface;
changing, by the timing controller, reference clock phase information based on the clock phase calibration signal and changing the phase of the reference clock signal based on the reference clock phase information that is changed by the timing controller; and
sampling, by each of the data driving circuits, the second data signal depending on the reference clock signal using a sampler.

* * * * *